United States Patent
Leib et al.

(10) Patent No.: US 7,825,029 B2
(45) Date of Patent: *Nov. 2, 2010

(54) METHOD FOR THE PRODUCTION OF STRUCTURED LAYERS ON SUBSTRATES

(75) Inventors: Jurgen Leib, Freising (DE); Florian Bieck, Mainz (DE); Dietrich Mund, Obersussbach (DE)

(73) Assignee: Schott AG, Mainz (DE)

( * ) Notice: Subject to any disclaimer, the term of this patent is extended or adjusted under 35 U.S.C. 154(b) by 1473 days.

This patent is subject to a terminal disclaimer.

(21) Appl. No.: 10/511,334

(22) PCT Filed: Apr. 15, 2003

(86) PCT No.: PCT/EP03/03884

§ 371 (c)(1),
(2), (4) Date: Jun. 22, 2005

(87) PCT Pub. No.: WO03/088340

PCT Pub. Date: Oct. 23, 2003

(65) Prior Publication Data

US 2005/0233503 A1    Oct. 20, 2005

(30) Foreign Application Priority Data

| Apr. 15, 2002 | (DE) | .............................. 202 05 830 U |
| May 23, 2002 | (DE) | .............................. 102 22 609 |
| May 23, 2002 | (DE) | .............................. 102 22 958 |
| May 23, 2002 | (DE) | .............................. 102 22 964 |
| Nov. 13, 2002 | (DE) | .............................. 102 52 787 |
| Jan. 16, 2003 | (DE) | .............................. 103 01 559 |

(51) Int. Cl.
*H01L 21/316* (2006.01)

(52) U.S. Cl. ...................... 438/694; 438/780; 438/778; 257/E21.245; 257/E21.244

(58) Field of Classification Search ................. 438/694, 438/780, 778; 257/E21.244, E21.245
See application file for complete search history.

(56) References Cited

U.S. PATENT DOCUMENTS 4,090,006 A * 5/1978 Havas et al. .................. 428/81

(Continued)

FOREIGN PATENT DOCUMENTS

DE          10222609.1 A1    5/2002

(Continued)

OTHER PUBLICATIONS

XP-002264775, Balanced Resistance Magnetoresistive Head Compensated Against Thermal and Piezoresistive Effects, R. Anderson et al., IBM Technical Disclosure Bulletin, vol. 17, No. 11, (Apr. 1975), pp. 3478-3480.

*Primary Examiner*—George Fourson
(74) *Attorney, Agent, or Firm*—Ohlandt, Greeley, Ruggiero & Perle, L.L.P.

(57) ABSTRACT

A method for the patterned coating of a substrate with at least one surface is provided. The method is suitable for the rapid and inexpensive production of precise patterns. The method includes the steps of: producing at least one negatively patterned first coating on the at least one surface, depositing at least one second layer, which includes a material with a vitreous structure, on the surface, and at least partially removing the first coating.

38 Claims, 10 Drawing Sheets

U.S. PATENT DOCUMENTS

| | | | |
|---|---|---|---|
| 4,396,458 A * | 8/1983 | Platter et al. | 216/19 |
| 4,506,435 A * | 3/1985 | Pliskin et al. | 438/296 |
| 2001/0055864 A1 | 12/2001 | Chan et al. | 438/551 |

FOREIGN PATENT DOCUMENTS

| | | |
|---|---|---|
| DE | 10222958.9 A1 | 5/2002 |
| DE | 10222964.3 A1 | 5/2002 |
| DE | 10252787.3 A1 | 11/2002 |
| DE | 10301559.0 A1 | 10/2003 |
| JP | 58172679 | 10/1983 |
| JP | 2000241985 | 9/2000 |

* cited by examiner

METHOD FOR THE PRODUCTION OF STRUCTURED LAYERS ON SUBSTRATES

BACKGROUND OF THE INVENTION

1. Field of the Invention

The invention relates to a method for producing patterned layers on substrates, in particular for producing patterned layers with a vitreous structure of surfaces of substrates.

2. Description of Related Art

To manufacture in particular integrated semiconductor components, optoelectronic components or other sensor or emitter components, it may be necessary or advantageous to produce precisely patterned passivation layers. For example, it may be necessary to introduce openings into an encapsulation at some positions in order to allow electrical contacts to be made with the packaged part. Glass is highly regarded and used for a wide range of applications, inter alia on account of its excellent passivation properties. The permeability to gas molecules from air is, by way of example, lower by orders of magnitude than that of plastics, which are otherwise used for the packaging and encapsulation of, for example, semiconductor components, and consequently a material with a vitreous structure, such as in particular a glass, may have favorable effects on the service life of the components. Furthermore, glasses also offer excellent protection against water, water vapor and in particular also against aggressive substances, such as acids and bases.

However, accurate processing of glass layers presents problems. For example, it is known to use photopatternable glasses, such as for example FOTURAN. However, glasses of this type are extremely expensive. Furthermore, it is possible to wet-chemically or dry-chemically etch glasses. However, particularly in the case of glasses, it is only possible to achieve low etching rates, and consequently a method of this type is also slow and accordingly too expensive for mass production. Moreover, the subsequent etching may also damage or destroy the encapsulated part. Accurate patterns can also be produced on glasses by laser machining, but this technique too is very slow and too expensive for mass production. Furthermore, there are various known mechanical treatment processes, but generally these do not make it possible to achieve the level of accuracy which can be achieved with other methods.

BRIEF SUMMARY OF THE INVENTION

Therefore, the invention is based on the object of providing for exact patterning of coatings which include glass or a material with a vitreous structure which can be carried out quickly and inexpensively yet nevertheless makes it possible to produce precisely positioned structures.

Highly surprisingly, this object is achieved by a method and a coated substrate as described in the independent claims. Advantageous refinements form the subject matter of the corresponding subclaims.

The method according to the invention for the patterned coating of substrates having at least one surface which is to be coated to this end comprises the steps of:

producing at least one negatively patterned first coating on the at least one surface, depositing a second layer, which includes a material with a vitreous structure, on the surface which has been provided with the first coating, at least partially removing the first coating.

The method is therefore based on applying a negative of the structures which are to be produced in the form of a patterned first coating. Then, the positive layers are produced in the second layer by deposition of the second layer, which includes a material with a vitreous structure, on that surface of the substrate which has been coated with the first, patterned layer. Then, in a subsequent step, the first coating is at least partially removed, so that positive structures remain, which are formed by the second layer. In the context of the method described, the terms positive and negative structures generally denote structures which are at least partially complementary with respect to one another. They also mean in particular that the at least one second coating may have both raised and recessed structures. The second layer, which includes a material with a vitreous structure, particularly preferably comprises a glass, in particular an evaporation-coating glass.

Layers with a vitreous structure are known to have an extremely good barrier action. In this context, a material with a vitreous structure is understood as meaning a material without a short-range order of the elements and/or substances which constitute this material with a vitreous structure and at the same time with a long-range order of the substances and/or elements. Compared to non-vitreous, i.e. substantially microcrystalline, polycrystalline or crystalline layers, the layers which are applied by means of the method according to the invention are distinguished, inter alia on account of the amorphous structure, by the substantial absence of grain boundaries. The composition of the layer which includes a material with a vitreous structure may advantageously be selected in such a way that it is matched to the material of the surface of the substrate.

With regard to the barrier properties of evaporation-coating glass for the encapsulation of components and other substrates, reference is also made to the applications DE 202 05 830.1, filed on Apr. 15, 2002,
DE 102 22 964.3, filed on May 23, 2002;
DE 102 22 609.1, filed on May 23, 2002;
DE 102 22 958.9, filed on May 23, 2002;
DE 102 52 787.3, filed on Nov. 13, 2002;
DE 103 01 559.0, filed on Jan. 16, 2003;

in the name of the same Applicant, the content of disclosure of which is hereby expressly incorporated by reference.

With regard to the barrier properties of evaporation-coating glass layers, measurements have shown that at evaporation-coating glass layer thicknesses in the range from 8 µm to 18 µm, helium leak rates of less than $10^{-7}$ mbar l s$^{-1}$ or less than $10^{-8}$ mbar l s$^{-1}$ are reliably achieved. For layers with a layer thickness of 8 µm and 18 µm, the measurements even gave helium leak rates of between 0 and $2\times10^{-9}$ mbar l s$^{-1}$, and these upper limit values are already substantially influenced by the measurement inaccuracy of the tests carried out.

The substrate used for the method may be either a component itself or a substrate which is subsequently joined to a component, for example.

The step of producing a negatively patterned first coating on the surface of the substrate may particularly advantageously comprise the step of uncovering regions of the at least one surface which is to be coated. In this way, the second layer, which includes a material with a vitreous structure, during deposition comes into direct contact with that surface of the component which is to be coated, and an intimate, direct join is created between the surface and the layer.

It is preferable for the method to be carried out while the substrate is still part of the wafer assembly, the substrate being a wafer or part of a wafer. Carrying out the method while the substrate is still part of the wafer assembly allows coated substrates of this type to be produced at particularly low cost. In particular, the method according to the invention can in this way also be used to package components while they are still joined to the wafer assembly, or may be part of a "wafer-level packaging" procedure. In this case, components may be present as dies of the substrate, or of the wafer. It is also possible for a substrate to be combined with a wafer with dies as part of the wafer assembly.

Various methods are suitable for the deposition of the second layer which includes a material with a vitreous structure. According to a preferred refinement of the method, the step of depositing a second layer which includes a material with a vitreous structure comprises the step of depositing a layer by evaporation coating.

In this context, it is recommended in particular to evaporate material by electron beam evaporation. One of the advantages of electron beam evaporation is that the power transmitted by the electron beam can be concentrated on a relatively small area by focusing the beam. As a result, it is possible to locally reach high temperatures on the target of the evaporator, so that high flow rates can be achieved with relatively low powers. This at the same time also reduces the thermal load by absorption of thermal radiation to which the substrate is exposed.

The step of evaporation coating of a layer which includes a material with a vitreous structure may advantageously also comprise the step of evaporation of evaporation-coating material, which when it has been deposited on the surface forms a material with a vitreous structure, from a single source. The fact that the material is deposited from a single source makes it possible to achieve a high reproducibility of the layers. Fluctuations in the layer stoichiometry caused by power fluctuations between a plurality of sources can be avoided in this way.

The layer may also be deposited from at least two sources by co-evaporation. This is advantageous, for example, in order to enable the layer composition to vary in a direction perpendicular to the surface. In this way, the material properties, such as for example the refractive index or else the temperature coefficient, can be varied in a direction perpendicular to the surface. A variation in the composition of the layer can of course also be achieved with other deposition methods, even with a single evaporation-coating source, for example by varying the heating power. The step of depositing a second layer which includes a material with a vitreous structure may therefore in general advantageously include the step of varying the composition of the material being deposited during deposition or the step of depositing a layer with a composition which varies in a direction perpendicular to the surface.

The deposition of a layer by evaporation coating may advantageously also include the step of plasma ion-enhanced evaporation coating. In this case, an ion beam is additionally directed onto the substrate which is to be coated. The ion beam may be generated by means of a plasma source, for example by ionization of a suitable gas. The plasma additionally densifies the layer and removes loosely attached particles from the substrate surface. This leads to particularly dense, defect-free deposited layers.

In addition to evaporation coating, it is also possible for other methods to be expediently used for coating with a layer with a vitreous structure. By way of example, the step of depositing a layer with a vitreous structure may comprise the step of sputtering on a layer with a vitreous structure. By sputtering it is possible, inter alia, to produce layers with a vitreous structure which comprise materials which only melt at high temperatures and are therefore not suitable for evaporation.

Furthermore, the step of depositing a layer with a vitreous structure may advantageously comprise the step of depositing a layer with a vitreous structure by means of chemical vapor deposition (CVD). By way of example, it is in this way also possible to deposit materials which otherwise have a vapor pressure which is too low or a melting point which is too high for evaporation. Since in CVD, in particular plasma-induced chemical vapor deposition (PICVD), the synthesis of the deposited material only takes place on the surface, it is in this way possible, for example, to produce layers which can only be evaporation-coated or sputtered on with difficulty. By way of example, these may be substances which have molecules with a high molecular weight which would be destroyed during evaporation or sputtering from a target.

A particular benefit of the method according to the invention is that the application of a layer with a vitreous structure by deposition is associated with generally very low heating of the substrate, for example compared to the melt deposition of a layer of this type. This is true of deposition by evaporation coating and of deposition by sputtering. The heating can be kept at a low level with CVD as well, for example in the case of pulsed plasma excitation or PICVD. Consequently, the temperature stresses after deposition are also only low. Therefore, in this way, by way of example, it also becomes possible to join layers with a vitreous structure directly to substrates which have a coefficient of thermal expansion which is very different than that of the layer.

Layers with a vitreous structure which comprise an at least binary materials system are particularly suitable for production of the patterned coating of the component. Layers of this type are generally distinguished by particularly low permeability rates, since they, unlike quartz glasses, for example, have scarcely any tendency to form crystalline regions. At least binary materials systems of this type may, for example, be composed of at least two metal oxides or silicon dioxide and one or more metal oxides.

Moreover, in an advantageous configuration of the method, the deposition of the layer with a vitreous structure may also comprise the step of co-deposition of an organic material. The co-deposition, for example the simultaneous deposition of the organic material together with the layer material which forms a layer with a vitreous structure may for example be effected by co-evaporation or deposition from the residual gas atmosphere. In this case, the molecules of the organic material are incorporated in the layer with a vitreous structure. The organic material may have a positive influence on the layer properties in numerous ways. Examples which may be mentioned in this respect are a higher flexibility of the layer with respect to mechanical loads, the matching of optical and mechanical properties, the improvement of the layer bonding, for example as a result of the layer being deposited as a gradient layer with a change in the organic content, the change in the packaging density and the layer microstructure and the influencing of the chemical properties of the layer, in particular by the addition of hydrophobic materials or getter materials.

The step of producing a negatively patterned first coating may advantageously comprise the step of resist-coating, in particular of resist-coating by means of spin-coating and/or spraying on and/or electrodeposition of a first coating. These techniques make it possible, inter alia, to produce coatings with a homogenous thickness. Moreover, to produce particular patterns, the resist-coating may also be carried out in a plurality of steps.

The step of producing a negatively patterned first coating may likewise also comprise the step of applying a photoresist film, in particular for subsequent photo-patterning of the film on the component. By way of example, the application of the film does not require long drying times, and consequently rapid further processing is possible.

The method according to the invention may particularly advantageously also be refined by the step of producing a negatively patterned first coating comprising the step of patterned printing-on of a first coating. Printing techniques can be used at particularly low cost combined, at the same time, with a good level of accuracy to produce a structured resist coating. By way of example, the coating can be produced by means of screen printing or ink jet printing. Of course, printing techniques of this type can also be combined with other methods. The first coating may furthermore also be patterned by embossing. The embossing of structures, like patterned resist-coating, constitutes a rapid and inexpensive method of patterning the coating.

The step of producing a negatively patterned first coating may also comprise the step of lithographic patterning of the first coating. Lithographic patterning is used in numerous ways, for example in semiconductor fabrication. This patterning technique is in widespread use and is therefore well developed, and consequently high levels of accuracy can be achieved for the structures combined, at the same time, with a high throughput. This method may also be combined, inter alia, with screen printing. In this way, it is possible for relatively coarse structures, such as for example the contours of the components on a wafer, to be patterned by printing on a photoresist and for the fine structure then to be produced by lithography. This refinement of the method according to the invention combines advantages of lithography with those of glass patterning.

Moreover, the lithographic patterning may also comprise the step of lithographic grey scale patterning. In the first coating, structures with side walls which are inclined relative to the perpendicular to the surface can be produced by means of grey scale patterning. Accordingly, the second layer then has structures with overhanging side walls.

In general terms, photopatternable materials, such as in particular photoresist, can be used for the first, patterned coating, since very fine and accurately positioned structures can be produced by exposure and development of the layer.

Depending on the material of the coating, various methods are also suitable for the at least partial removal of the first coating. By way of example, the coating may be dissolved in a suitable solvent.

It is also possible for the removal of the first coating to take place by wet-chemical and/or dry-chemical means, in particular by the first coating being burnt in an oxidizing plasma. In general terms, a chemical reaction, such as etching or burning of the material of the first coating, may be advantageous in order for the coating to be eliminated even in relatively inaccessible regions on the surface of the component, for example in trenches or channels which can be produced using the method according to the invention.

To produce the positively patterned second coating, the step of at least partially removing the first coating may advantageously comprise the step of lifting off regions of the at least one second layer. In this case, the regions of the second layer which cover the first coating are lifted off and thus removed during removal of the first coating.

This variant of the method is expedient in particular if the second layer does not completely cover the first coating.

A preferred variant of the method, which can be used even if the first coating is completely covered by the second layer, provides, as an additional method step, the at least partial uncovering of the first coating, so that this first layer is no longer hermetically covered by the second layer. This allows external attack on the first coating.

To create access for the subsequent removal of the first coating, it is advantageous if the step of at least partial uncovering of the first coating comprises the step of planarizing the coated surface. In this case, the coated surface of the component is planarized until the layer with a vitreous structure has been removed at the locations at which structures of the first, patterned coating are located.

The partial abrasion of the layer with a vitreous structure or the at least partial uncovering of the first coating may expediently be effected by mechanical abrasion, in particular by means of grinding and/or lapping and/or polishing.

The method may additionally also comprise the step of aftertreatment of the positively patterned second layer. The aftertreatment may, for example, be used to round edges of the structures. Suitable aftertreatment steps in this context are in particular wet-chemical and/or dry-chemical and/or thermal reflow. The structures may also be aftertreated by doping, in order, for example, to alter optical or electrical properties of the structures.

In the method according to the invention, the steps of producing a negatively patterned first coating on the at least one surface and of depositing at least one further layer with a vitreous structure on the surface provided with the first coating may particularly advantageously also be carried out repeatedly. In this way, it is possible, inter alia, to apply multilayered patterned layers with a vitreous structure. The step of removing the first coating may in this case take place in each case after the at least partial uncovering of the first coating. However, it is also possible for this step not to be carried out each time, but rather only after the last layer with a vitreous structure has been applied. In this way, the first coating may in each case also be used as a substrate for a subsequent coating. This makes it possible for layers with a vitreous structure with unsupported regions, such as for example bridges or tubes, to be produced on the substrate.

The base may itself be used to cover a component. In this case, the method may advantageously also comprise the step of joining the substrate to a further substrate, in particular a semiconductor component and/or an optoelectronic component and/or a micro-electromechanical component.

The method according to the invention can be used to define a phase grating and/or at least one optical component and/or at least one channel and/or at least one waveguide in the patterned layer with a vitreous structure. Furthermore, the structures of the layer may be at least partially filled. In particular, the structures may be filled with conductive material and/or a transparent material. The filling with conductive material makes it possible to create electrical connections both in a direction perpendicular to the surface of the substrate and in a direction parallel to the surface of the substrate. Moreover, filling with transparent material makes it possible to define waveguides or other optical components, such as for example a phase grating.

Moreover, electrical connections can advantageously be produced if the method also comprises the step, also known as "plating", of applying at least one conductive region, in particular an interconnect, to the surface of the substrate and/or the layer with a vitreous structure. This can be achieved, for example, by evaporation-coating of metallic material onto predefined regions of the surface.

Moreover, passive components, such as capacitors, resistors or inductances, can be produced on the substrate by filling structures or applying conductive regions.

In particular in the case of multilayered coatings, a combination of these method steps makes it possible to produce multilayer circuit boards including the redistribution of contacts, the routing, the electrical rewiring or the through-contacting of electrical connections through individual layers or the substrate. Multilayer circuit boards with glass as insulator material are of particular interest, inter alia on account of their excellent radio frequency properties. For example, circuit boards of this type are distinguished by a low electrical loss factor. Moreover, these circuit boards are highly dimensionally stable.

According to a refinement of the method, the substrate has at least two surfaces which are to be coated and in particular lie on substantially opposite sides, in which case the steps of producing at least one negatively patterned first coating on the at least one surface, of depositing at least one second layer, which includes a material with a vitreous structure, on the surface which has been provided with the first coating and of at least partially removing the first coating may be carried out on each of the surfaces. In this way, it is possible to provide substrates with a patterned coating on two sides. By way of example, it is in this way possible to produce optical components, such as for example gratings, on opposite sides of the substrate.

Moreover, for further processing of the substrate which has been provided with a patterned coating, it may be advantageous if the method additionally comprises the step of applying a bonding layer to the second layer. Bonding layers of this type may, for example, comprise a seed layer for a subsequent metallization and/or an adhesive layer. The substrate can then be joined to a base on the coated side by means of the bonding layer. A seed layer of this type can also be used to produce regions which are metallized in patterned form.

The first coating, which is applied in accordance with the invention and is at least partially removed again after deposition of the second layer, functions as a mask for the patterning of the second layer. Accordingly, it is also within the scope of the invention to provide a further embodiment of a method which allows patterned evaporation-coating glass layers to be deposited on a substrate on a surface which is to be coated, in which the substrate is coated with an evaporation-coating glass through a mask. In this case, the mask is arranged between the surface which is to be coated and the source and has openings or cut-outs which match the intended structures on the glass layer which is to be applied.

To obtain well-defined structures, it is advantageous for the mask to be arranged as close as possible to the surface which is to be coated. To this end, according to a refinement of the method, the mask is brought into contact with that surface of the substrate which is to be coated.

The mask may also, for example, be joined to the substrate in order to ensure close contact between mask and substrate. According to yet another refinement of the method according to the invention, the mask is to be adhesively bonded to the substrate. The mask can then be removed after the coating has taken place.

The method can also be repeated in order to obtain multilayered coatings, in which case, by way of example, the individual layers may also be produced by means of differently patterned masks, so that the individual layers accordingly have different structures.

It is also within the scope of the invention to provide a coated substrate which can be produced in particular using a method according to the invention. Accordingly, a coated substrate of this type, on at least one side, has a patterned coating which comprises a material with a vitreous structure. According to the method of the invention, the coating can be deposited on a negatively patterned first coating on the at least one side, and the negatively patterned coating can be at least partially removed. One example of a suitable material with a vitreous structure is an evaporation-coating glass, but it is also possible, by way of example, to use other glasses which are deposited, for example, by sputtering or CVD.

The substrate may include at least one electronic circuit arrangement, in particular an integrated electronic circuit arrangement and/or an optoelectronic circuit arrangement and/or at least one micro-electromechanical component. The substrate may also be joined to a component which includes an integrated electronic circuit arrangement and/or an optoelectronic circuit arrangement and/or at least one micro-electromechanical component. The patterned coating may in this case constitute a cut-out or a complete or partial cover for these components.

The patterned coating of the substrate may have different functional structures depending on the intended application. By way of example, the coating may include at least one channel or trench. A channel may, for example, be used to receive an optical fiber. The channel may also be filled with conductive material, so that it is possible to produce electrical contacts. In this case, the channel may extend both parallel to the coated surface of the substrate and perpendicular thereto.

For certain optical applications, it is particularly advantageous if the substrate includes at least one waveguide. Furthermore, at least two waveguides which are coupled to one another may be defined in the patterned coating. There are numerous possible applications for a coated substrate of this type, for example as an integrated optical multiplexer or demultiplexer. In general terms, the coupling of a plurality of waveguides can also be used for optical rewiring.

Moreover, at least one cavity can be defined by the coating. The cavity can be used, inter alia, to receive components, such as for example microelectronic and/or micro-electromechanical components or, for example, fluids.

In addition to cavities, it is also possible for there to be one or more cut-outs in the coating. Together with a cut-out, the coating can be used, for example, as a spacer for a further substrate or an optical component.

Moreover, there may be interconnects on the patterned coating, in order to connect various electrical or electronic components. The interconnects can be produced, for example, by filling channels or trenches in the patterned coating or by the application of metal layers, for example by evaporation coating. In the same way, it is also possible for passive electronic components, such as capacitors, resistors or inductances, to be defined in the coating.

In particular, the substrate may have a multilayered coating. In this respect, it is not necessary for each layer to comprise a vitreous material. Rather, in this case it is possible to combine various materials and also various patterning methods with one another.

Depending on the intended application, the substrate may comprise a material which includes glass and/or metal and/or plastic and/or ceramic and/or a semiconductor, in particular silicon and/or gallium arsenide. Glass or plastic substrates can be used, for example, as a cover for integrated electronic, optoelectronic or micro-electromechanical components. On the other hand, coated semiconductor substrates may, for example, themselves include components of this type.

Of course, the patterned coating does not have to be present on only one side of the substrate. Rather, a coated substrate may advantageously have a patterned coating which comprises a material with a vitreous structure on each of two in particular substantially opposite sides.

It is also within the scope of the invention to provide a device for carrying out the method according to the invention and/or for producing a substrate with a patterned coating. Accordingly, a device of this type, in addition to other means for processing a substrate, comprises a means for depositing a layer which comprises a vitreous material.

BRIEF DESCRIPTION OF THE SEVERAL VIEWS OF THE DRAWINGS

The invention is explained in more detail below on the basis of preferred embodiments and with reference to the appended figures, in which identical reference symbols refer to identical or similar parts throughout the figures. In the drawing.

DETAILED DESCRIPTION OF THE INVENTION

Figure 1A:
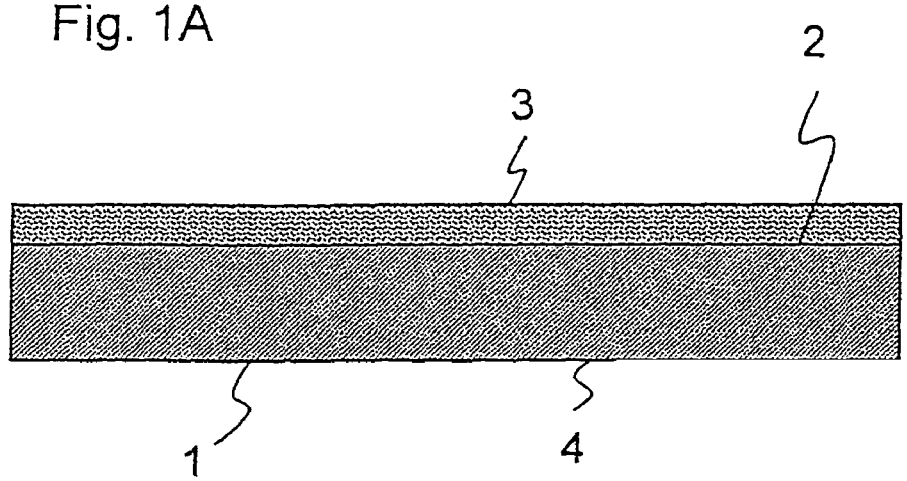
FIGS. 1A to 1E use diagrammatic cross-sectional views to illustrate the method steps used for the patterned coating of substrates.

The text which follows refers first of all to FIGS. 1A to 1E, which use diagrammatic cross-sectional views to illustrate the method steps involved in the production of a patterned substrate in accordance with a first embodiment of the invention. To produce a patterned coating, first of all a first coating 3 is applied to the substrate 1, as shown in FIG. 1A, on the surface 2 which is to be coated. The substrate 1 is preferably joined to further substrates in a wafer assembly. In the embodiment illustrated in FIGS. 1A to 1E, the substrate is illustrated, by way of example, as a passive substrate which can be used as a cover for an active substrate, such as for example an integrated electronic component, an optoelectronic component or a micro-electromechanical component. However, it is of course also possible to use the method according to the invention to apply patterned coatings directly to components of this type, which then correspondingly serve as substrate 1. In particular, all the embodiments of the invention explained below can advantageously be carried out while the substrate is still part of the wafer assembly.

Figure 1B:
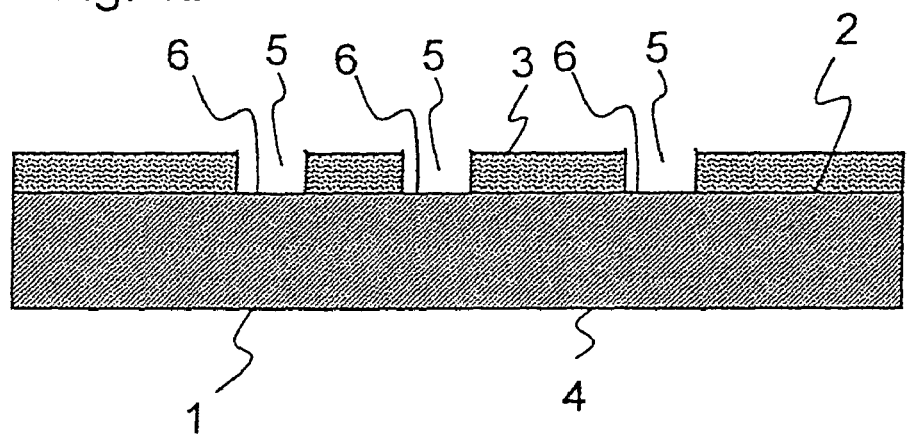

FIG. 1B shows a cross-sectional view through the substrate following a further method step. In this step, structures 5 have been introduced into the first coating. These structures create a negative patterning which is complementary to the final patterned coating when seen in plan view. The patterning has been carried out in such a way that regions 6 of the surface 2 of the substrate 1 which is to be coated have been uncovered.

The patterning may take place inter alia by photolithography, for which purpose the coating 3 comprises, by way of example, a photoresist, into which the structures 5 have then been introduced by exposure and development.

According to a variant of the method, the coating 3 is not patterned after the application but rather directly during application of the layer. This can be achieved by the layer being, for example, printed onto the substrate 1 by means of a suitable printing process, for example by means of screen printing. In this variant of the method, the processing state of the substrate 1 shown in FIG. 1A is skipped. Of course, this variant may, however, also be combined with subsequent patterning, for example by a photoresist being printed in patterned form onto the surface 2 of the substrate 1 and the printed-on structures then being patterned further, for example in order to produce additional, finer structures. The step of producing a negatively patterned coating has ended once the state of the substrate shown with reference to FIG. 1B has been reached.

Figure 1C:
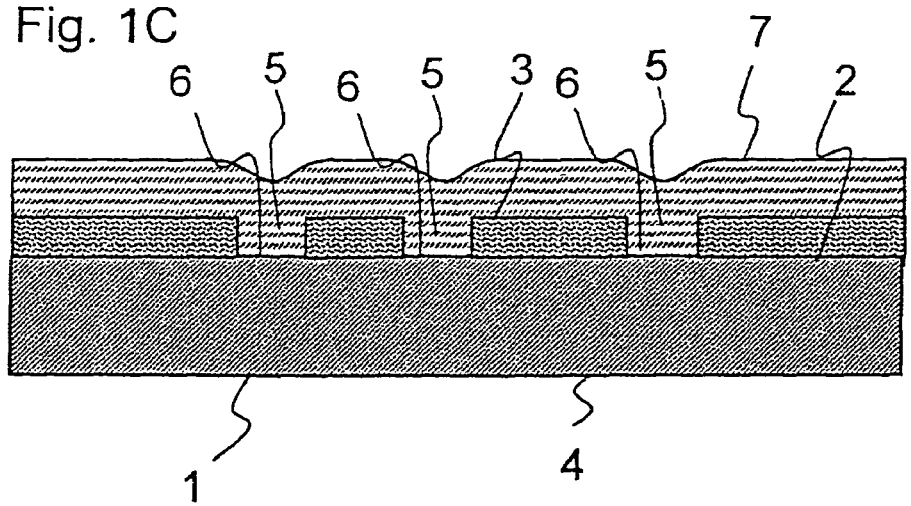

FIG. 1c shows the substrate after the step of depositing a layer 7 with a vitreous structure on that surface 2 of the substrate 1 which has been provided with the first coating 3. The layer 7 in this case preferably comprises an evaporation-coating glass, the glass being deposited by electron beam evaporation on the substrate 1 which has been coated with the first patterned coating 3. The layer 7 covers the uncovered regions 6 and the layer 3.

According to a refinement of the invention, the second layer 7 can also be deposited by plasma ion-enhanced evaporation coating in order to obtain a particularly dense and defect-free layer.

The evaporation-coating glass which has the following composition in percent by weight:

| Components | % by weight |
| --- | --- |
| $SiO_2$ | 75-85 |
| $B_2O_3$ | 10-15 |
| $Na_2O$ | 1-5 |
| $Li_2O$ | 0.1-1 |
| $K_2O$ | 0.1-1 |
| $Al_2O_3$ | 1-5 | has proven particularly suitable.

A preferred evaporation-coating glass of this type is glass 8329 produced by Schott having the following composition:

| | |
| --- | --- |
| $SiO_2$ | 84.1% |
| $B_2O_3$ | 11.0% |
| $Na_2O \approx$ | 2.0%} |
| $K_2O \approx$ | 0.3%} 2.3% (in the layer $\Rightarrow$3.3%) |
| $Li_2O \approx$ | 0.3%} |
| $Al_2O_3 \approx$ | 2.6% (in the layer <0.5%) |

The electrical resistance is approximately $10^{10}$ Ω/cm (at 100° C.).

Furthermore, in pure form this glass has a refractive index of approximately 1.470.

The dielectric constant $\in$ is approximately 4.7 (at 25° C., 1 MHz), tan δ is approximately $45 \times 10^{-4}$ (at 25° C., 1 MHz). The evaporation-coating process and the different volatilities of the components of this system readily results in different stoichiometries between the target material and the layer which has been applied by evaporation coating. The deviations in the layer applied by evaporation coating are given in parentheses. A further group of suitable evaporation-coating glasses has the following composition in percent by weight:

| Components | % by weight |
|---|---|
| $SiO_2$ | 65-75 |
| $B_2O_3$ | 20-30 |
| $Na_2O$ | 0.1-1 |
| $Li_2O$ | 0.1-1 |
| $K_2O$ | 0.5-5 |
| $Al_2O_3$ | 0.5-5 |

A preferred evaporation-coating glass from this group is the glass G018-189 produced by Schott, having the following composition:

| Components: | % by weight |
|---|---|
| $SiO_2$ | 71 |
| $B_2O_3$ | 26 |
| $Na_2O$ | 0.5 |
| $Li_2O$ | 0.5 |
| $K_2O$ | 1.0 |
| $Al_2O_3$ | 1.0 |

The glasses which are preferably used in particular have the properties listed in the table below:

| Properties | 8329 | G018-189 |
|---|---|---|
| $\alpha_{20-300}$ [$10^{-6}K^{-1}$] | 2.75 | 3.2 |
| Density (g/cm$^3$) | 2.201 | 2.12 |
| Transformation point {° C.] | 562 | 742 |
| Refractive index nd | 1.469 | 1.465 |
| Hydrolytic resistance class in accordance with ISO 719 | 1 | 2 |
| Acid resistance class in accordance with DIN 12 116 | 1 | 2 |
| Alkali resistance class in accordance with DIN 52322 | 2 | 3 |
| Dielectric constant $\epsilon$ (25° C.) | 4.7 (1 MHz) | 3.9 (40 GHz) |
| tan$\delta$ (25° C.) | 45 * $10^{-4}$ (1 MHz) | 26 *$10^{-4}$ (40 GHz) |

Figure 1D:
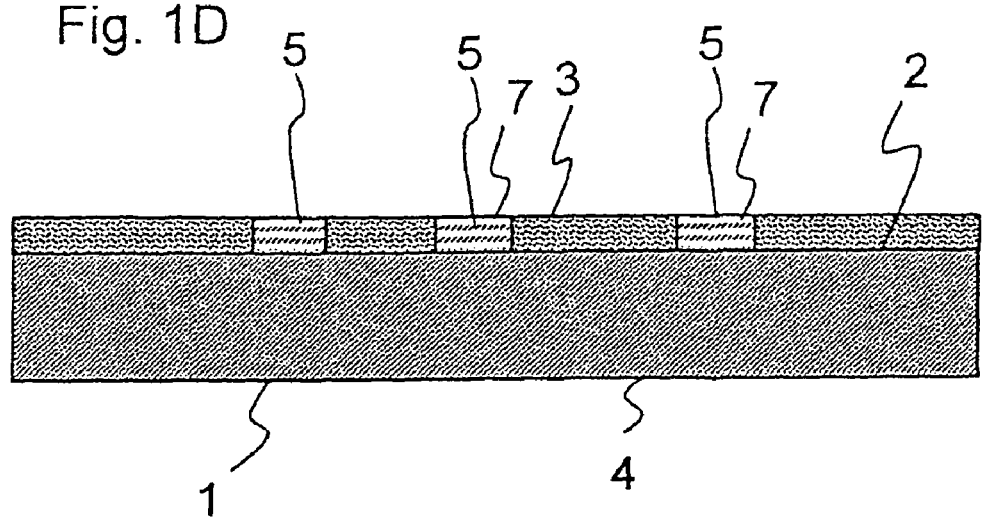

FIG. 1D shows the substrate after the following step of uncovering the first coating 3. In this variant of the method, the coating was uncovered by planarization of the coated surface. For this purpose, the coated surface was surface-ground until the layer 7 on the first coating had been removed, so that the first coating 3 beneath it was uncovered again making it accessible.

Figure 1E:
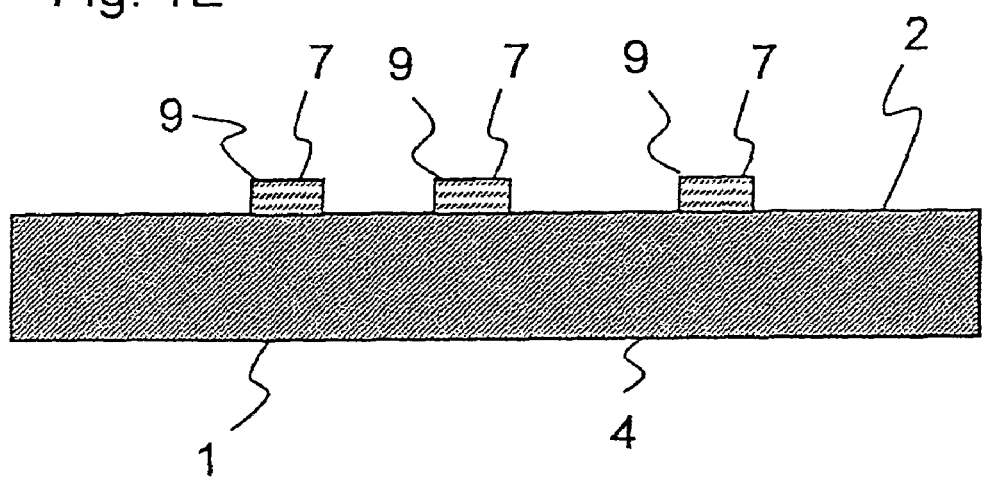

FIG. 1E shows a subsequent method step in which the first coating has been removed. Finally, a positively patterned second layer 7 remains on the substrate as a result of the evaporation-coating of the layer 7 onto the negatively patterned coating 3 and the removal of the first coating after it has been uncovered. The structures 9 of the positively patterned second layer 7 in this case cover the regions 6 which are uncovered or not covered by the first coating 3.

The first, negatively patterned coating can be removed, for example, by being dissolved in a suitable solvent or by wet-chemical or dry-chemical etching. Burning or oxidation in an oxygen plasma can advantageously also be used to remove the coating.

Figure 2A:
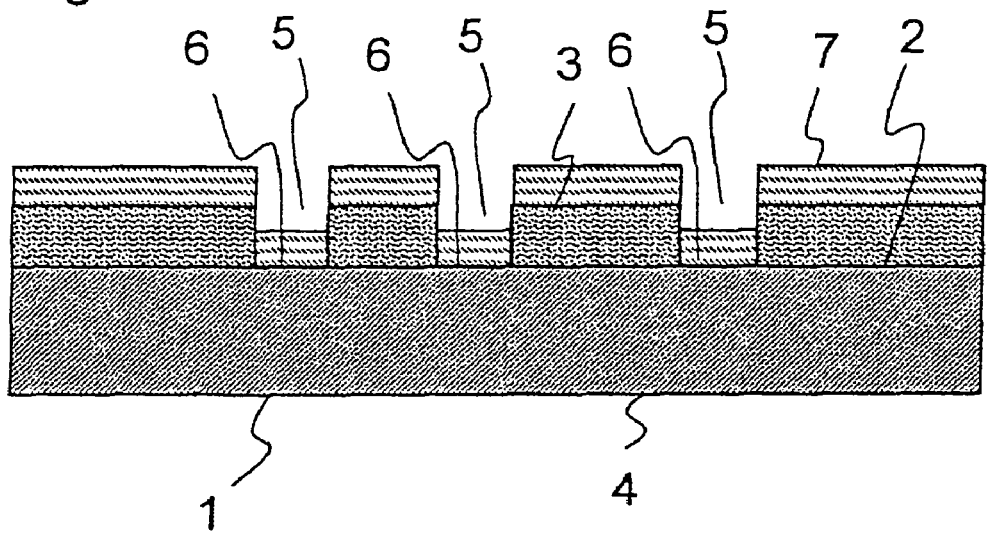
FIGS. 2A and 2B show a variant of the method steps illustrated with reference to FIGS. 1C to 1E, FIGS. 3A to 3F use diagrammatic cross-sectional views to illustrate the method steps used for the multilayered patterned coating of a substrate, FIGS. 4A to 4C use diagrammatic views to illustrate the method steps used for the multilayered patterned coating of a substrate in accordance with a further embodiment of the invention.
Figure 2B:
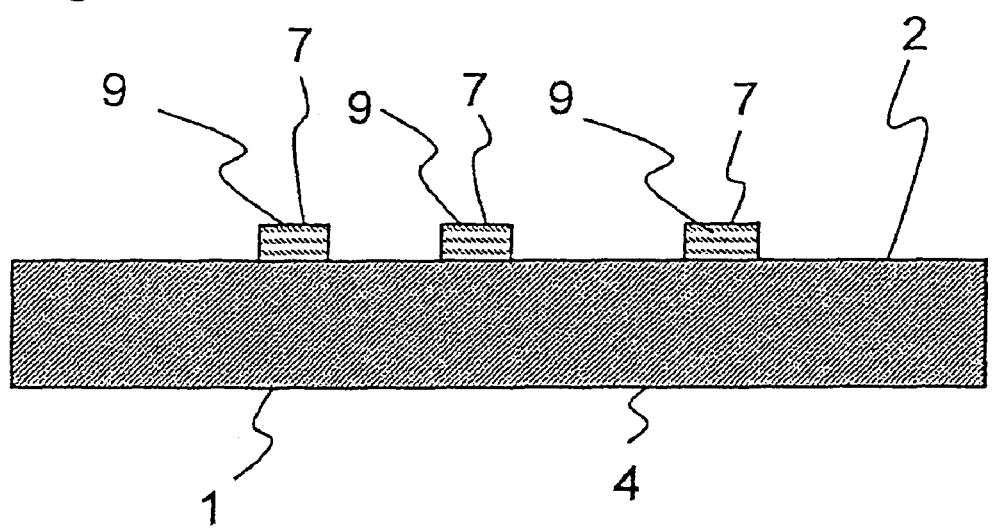

The following text, referring to FIGS. 2A and 2B, explains a preferred variant of the method steps shown in FIGS. 1D and 1E. In this variant of the method, first of all the substrate 1 is prepared by application of a patterned first coating 3 as has been shown in FIGS. 1A and 1B. Once again, the coating 3 has negative structures 5 which leave clear regions 6 of the first surface 2. Once again, a second layer 7 is deposited on the surface of the substrate which has been prepared in this way, for example by evaporation coating with an evaporation-coating glass. However, in this case the layer thickness of the layer 7 is not selected to be so great that the layer 7 is continuous. This is achieved by selecting for the layer 7 a layer thickness which is less than the layer thickness of the first coating 3. This phase of the method is shown in FIG. 2A.

The first coating 3 can then be removed directly without any uncovering operation, for example by the planarization shown with reference to FIG. 1C, being required, since the fact that the second layer 7 is not continuous means that access to the first layer 3 is retained. The regions of the layer 7 which are in this case located on the first coating 3 are lifted off and thereby removed during removal of the first coating 3. As a result, as shown in FIG. 2B, what remains is once again a patterned second coating 7 with positive structures 9.

In an additional step, it is also possible for a bonding layer which covers the top sides of the structures 9 remote from the substrate surface to be applied to the structures 9 of the patterned second layer 7 of the embodiments shown in FIG. 1E or 2B. A bonding layer of this type may, for example, comprise a seed layer for a subsequent metallization or, for example, an adhesive layer.

FIGS. 3A to 3F show a further embodiment of the method according to the invention, this embodiment being used to produce multilayered patterned coatings.

For the sake of clarity, some of the method steps which have been explained with reference to FIGS. 1A to 1E and/or 2A and 2B are not shown in detail in FIGS. 3A to 3F.

Figure 3A:
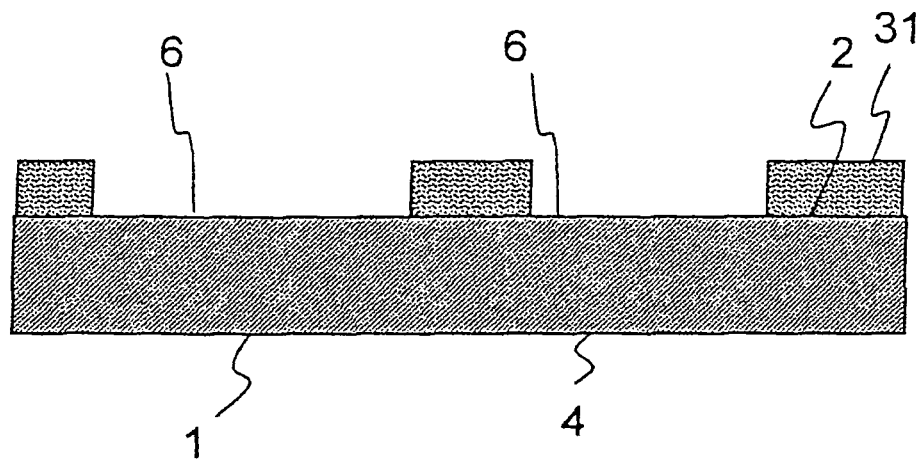

FIG. 3A shows a substrate 1 on which a patterned first coating 31 has been produced. The processing state of the substrate 1 therefore substantially corresponds to that shown in FIG. 1B.

Figure 3B:
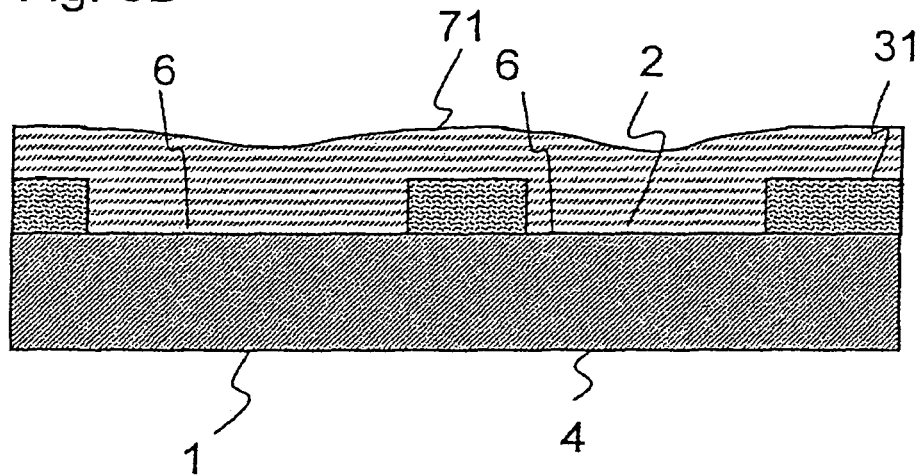
Figure 3C:
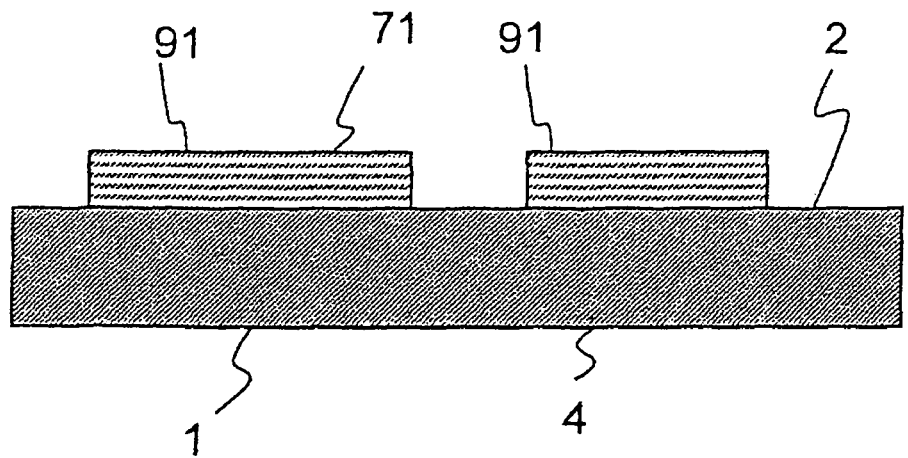
Figure 3D:
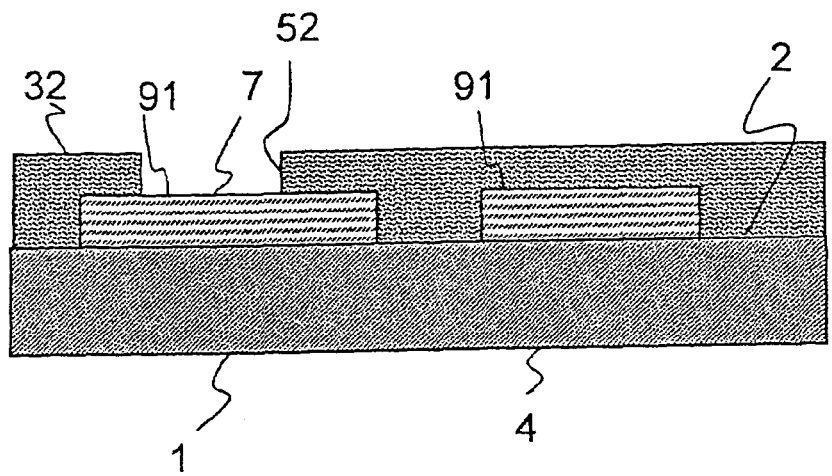
Figure 3E:
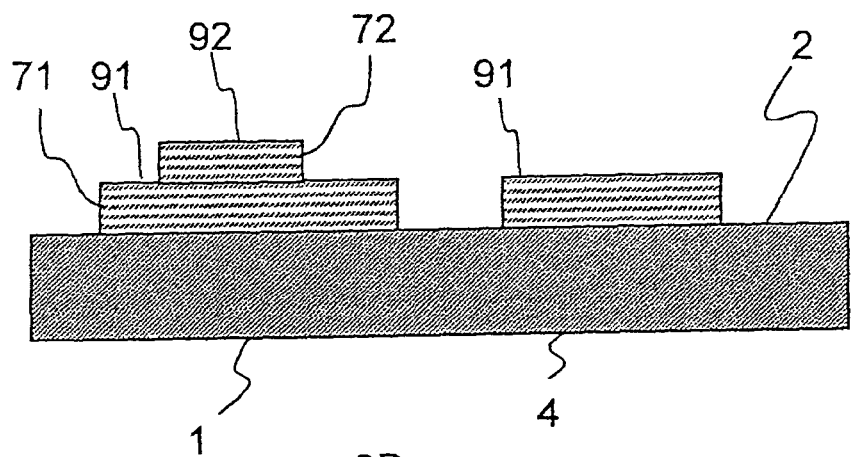

FIG. 3B shows the result of the subsequent step of depositing a second layer 71, which includes a material with a vitreous structure, on the surface which has been provided with the first coating 31. Then, the layer 71 is once again abraded in the regions coated with the layer 31 by grinding and planarization of the coated surface of the substrate 1, and the layer 31 which is then uncovered is removed, so that what remains is a positively patterned second layer 71 with structures 91. This processing state is illustrated in FIG. 3C.

To apply further layers of a multilayered coating, a further first patterned coating 32 is produced on the surface which has been coated in this way. This coating comprises the negative structures 52 of the further first coating 32 on the structures 91 of the patterned second layer 71, as shown with reference to FIG. 3E. Then, a layer 72 which includes a material with a vitreous structure is applied once again, after which the layer 32 is uncovered by grinding down the layer 72 and the layer 32 is then removed.

Figure 3F:
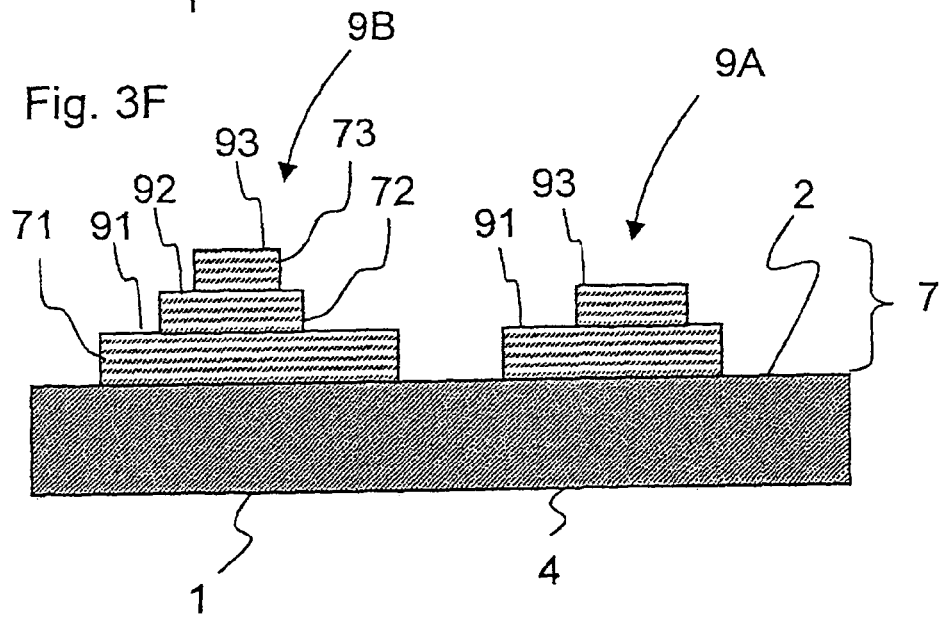

If appropriate, these method steps can be repeated a number of further times. FIG. 3F shows the substrate after the application of a further layer 73 with structures 92. The plurality of layers 71, 72 and 73 as a whole in this case once again form a patterned coating 7 which comprises a vitreous material and includes structures 9A and 9B. If necessary, these structures can also be produced in such a way that individual structures do not include material of each coating of the individual layers 71, 72, 73. Moreover, the layers may also include different materials and have different layer thicknesses. In this way, it is possible to combine layers comprising vitreous material with layers which include other materials, such as for example metal, ceramic, plastic or semiconducting materials.

In particular, the individual layers 71, 72, 73 of a multilayered coating of this type may also be produced by the variant of the method illustrated in FIGS. 2A and 2B, which involves the layers being lifted off.

Figure 4A:
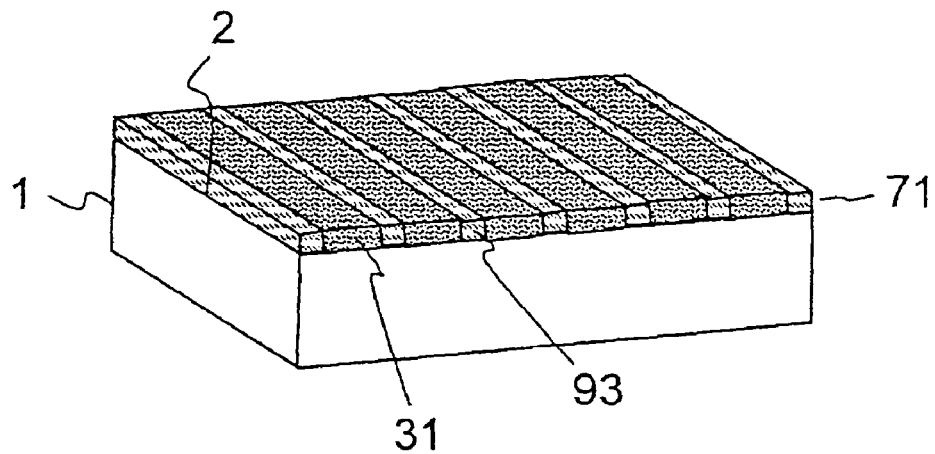
Figure 4B:
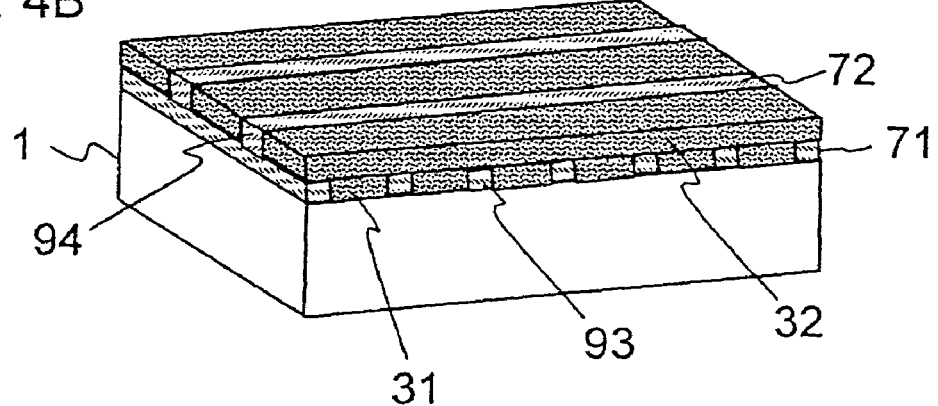
Figure 4C:
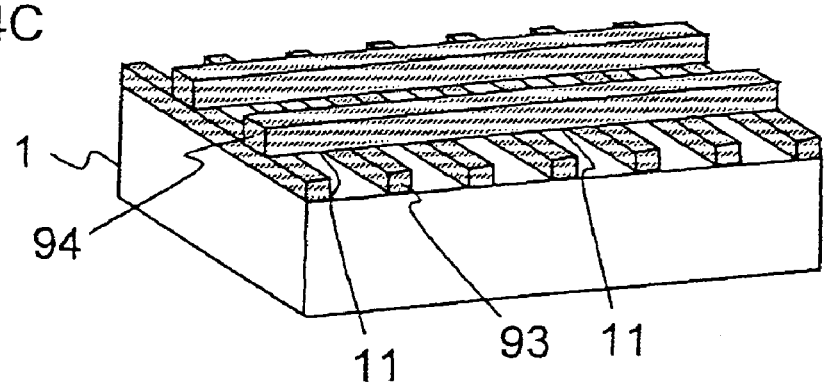

Moreover, during production of a multilayered patterned coating, the negative coating does not necessary have to be removed after each application of a layer. FIGS. 4A to 4C show a variant of the method of this type by way of example for a two-layered patterned coating. FIG. 4A in this respect shows a view of the substrate which has been provided with a negatively patterned first coating 31 on the side 2 which is to be coated. The coating 31 includes, by way of example, trenches as negative structures. Once again, a layer 71 which includes a material with a vitreous structure has been deposited on the surface which has been coated in this way, and the layer 31 is uncovered again by the surface being ground down. The layer 71 has structures 93 in the form of raised ribs or strips which are complementary to the trenches. FIG. 4A therefore corresponds to the processing state shown in FIG. 1D. Ribs of this type can be used, for example, as waveguides or, in a regular arrangement, as gratings.

As shown with reference to FIG. 4B, the same procedure can then be used during application of a further layer 72 with rib- or strip-like structures 94 which are formed as structures which are positive or complementary to trenches in the further coating 32. The structures 93 and 94 on the surface 2 of the substrate are in this case, by way of example, arranged perpendicular to one another.

In this case, however, unlike in the variant of the method according to the invention which has been explained with reference to FIGS. 3A to 3F, the first patterned coating 31 is not removed prior to the application of a further layer 72. Nevertheless, a common feature of both variants is that the steps of producing a negatively patterned first coating on the at least one surface of the substrate 1 and the deposition of a second layer which includes a material with a vitreous structure on the surface which has been provided with the first coating are carried out repeatedly.

FIG. 4C shows the substrate 1 with the finished two-layer patterned coating 7 which comprises the layers 71 and 72. After the final layer 72 has been applied and the further first coating 32 has been uncovered by planarization of the coated surface of the substrate, the first coating 31 and the further first coating 32 were removed.

The fact the first coating 31 is not removed prior to the deposition of the layer 72 with a vitreous structure means that the structures of one or more layers of the multilayered coating may have unsupported regions. On account of the strip-like structures 93 and 94 of the layers 71 and 72, respectively, being arranged perpendicular to one another, the structures 94 have unsupported regions 11 in the form of bridges which are therefore not supported by a base or a layer below them. Therefore, the variant of the method described here makes it possible to produce multilayered gratings stacked on top of one another. Structures of this type can advantageously be used, for example, as photonic crystals. The structures can also be used as waveguides. In particular, coupled waveguides can be produced in one or more layers using the method according to the invention.

Figure 5A:
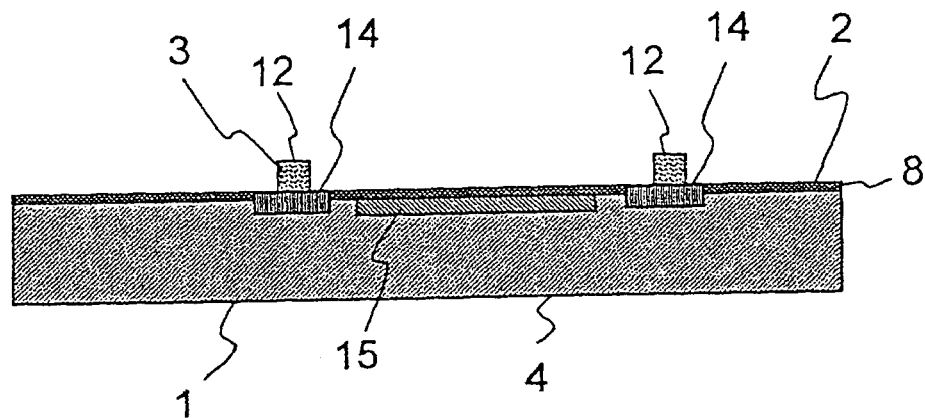
FIGS. 5A to 5C show an advantageous refinement of the method for producing through-contacts.
Figure 5B:
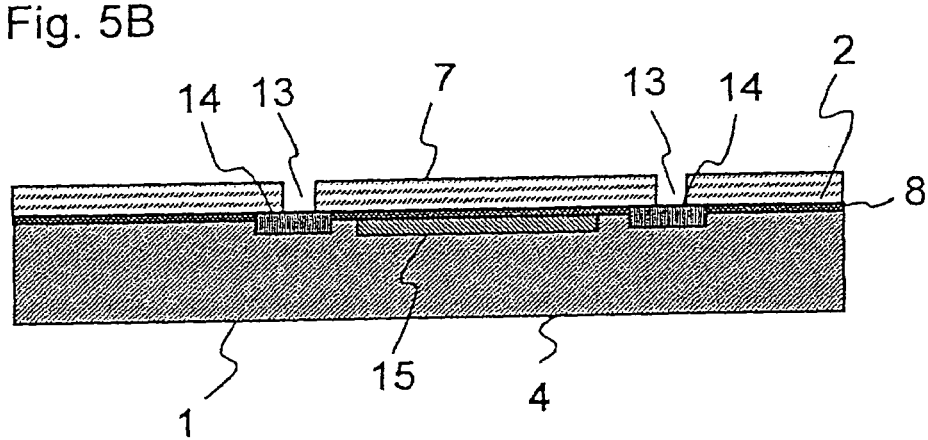
Figure 5C:
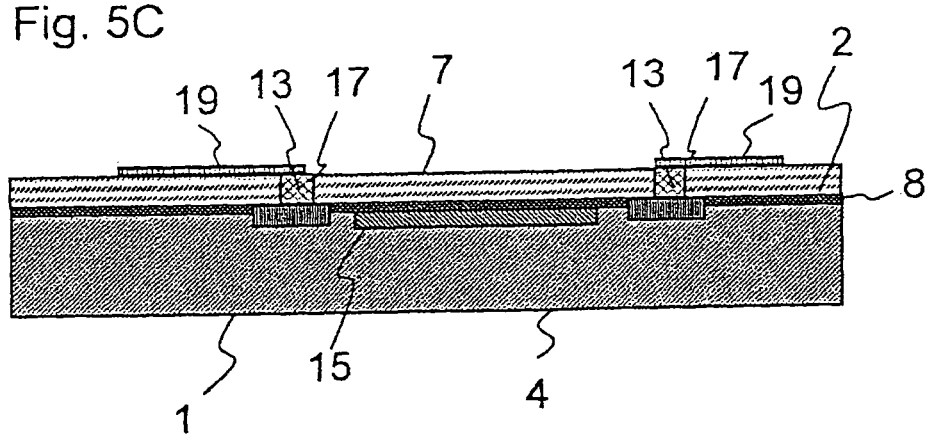

The text which follows refers to FIGS. 5A to 5C, which illustrate an advantageous refinement of the method for producing through-contacts through an encapsulation on the basis of cross-sectional views through a substrate 1. In this case, the substrate 1 has, by way of example, an active layer 15 on one side 2. This layer may include an integrated electronic circuit arrangement or, for example, an optoelectronic circuit arrangement. Contact surfaces or bonding pads 14 for making contact with the components of the active layer 15 are electrically connected to the active layer 15. The surface 2 additionally has a diffusion barrier layer 8, which is in widespread use in semiconductor fabrication to protect the integrated circuits of the active layer. A diffusion barrier layer 8 of this type may also be advantageous during the deposition of evaporation-coating glass as patterned layer, since evaporation-coating glass may release sodium ions which may be harmful to the circuits of the active layer 15. As shown in FIG. 5A, a patterned first coating 3 has been applied to the surface 2. The coating 3 is applied in such a way that its structures 12 partially or completely cover the contact surfaces 14 but other parts of the surface 2 which is to be coated remain uncovered.

Then, a layer 7 which comprises a vitreous material is once again deposited. The coated side of the substrate is then ground down and planarized again until the structures 12 of the first coating 3 have been uncovered, whereupon the uncovered first coating is removed. Alternatively, the lift-off technique shown with reference to FIGS. 2A and 2B can also be used for patterning in this embodiment. In this way, as shown in FIG. 5B, cut-outs 13 are produced in the second coating 7, which represent structures which are positive or complementary to the negative structures 12.

In a subsequent step, the cut-outs in the second layer 7 are then filled with a conductive material, so that, as shown in FIG. 5C, conductive through-contacts 17 are produced in the cut-outs. In this way, a hermetic encapsulation is produced on the side 2 of the substrate 1. In addition, it is also possible for interconnects 19, which are connected to the contact surfaces formed on the outer side of the through-contacts 17, to be applied to the patterned second layer 7. This can be used, for example, to redistribute the contacts. The interconnects may advantageously be produced by evaporation-coating of metal layers.

Figure 6:
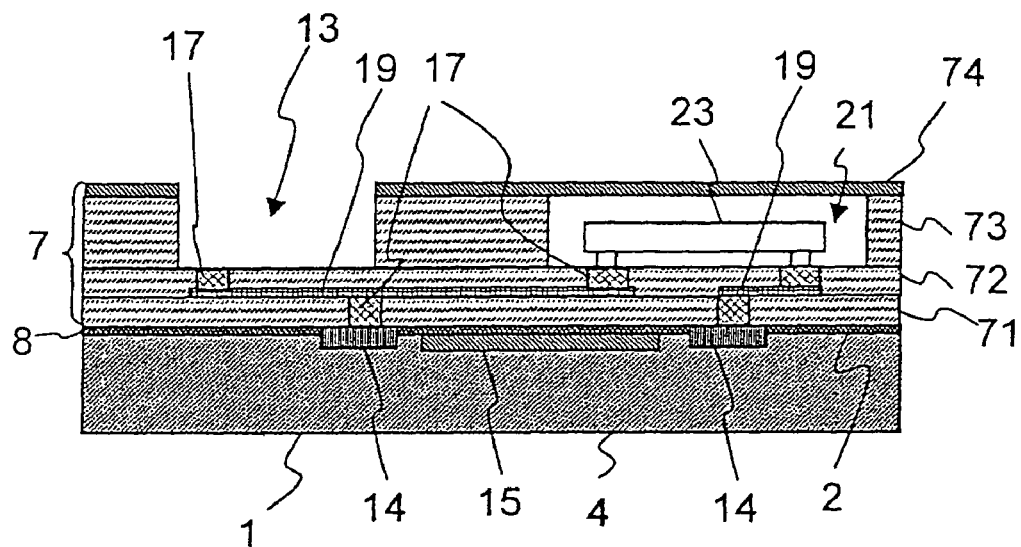
FIG. 6 shows an embodiment of a substrate with a multilayered coating.

The text which follows refers to FIG. 6, which, by way of example, illustrates an embodiment of a substrate 1 which has been coated in accordance with the invention with a multiple layer 7. In this exemplary embodiment, the layer 7 comprises the individual layer 71, 72, 73 and 74. In this case, the individual layers 71 to 73 comprise materials with a vitreous structure. A cut-out created in individual layer 73 and the individual layer 74 which is used as a cover inter alia define a cavity 21 in the multiple layer 7. A component 23, which is connected via through-contacts 17 and interconnects, to the active layer 15 and a through-contact 17 located in a further cut-out 13, is accommodated in the cavity. The component may, for example, comprise a micro-electromechanical actuator or a piezoelectric element or else a sensor. In addition to active components, it is also possible for passive elements, such as for example passive filter elements, to be accommodated in a cavity of this type.

Figure 7:
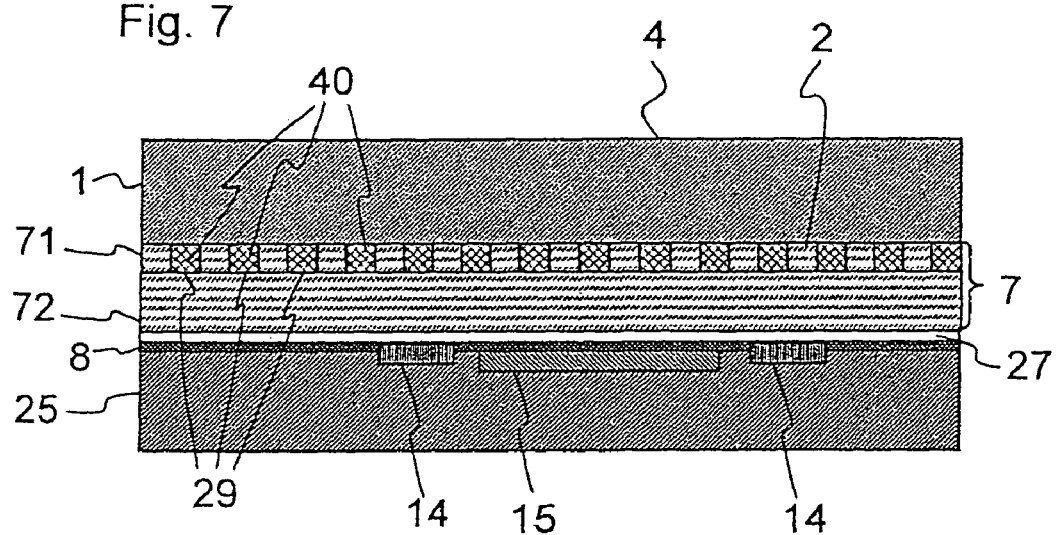
FIG. 7 shows an embodiment of a coated substrate which is joined to a further substrate.

The arrangement shown in FIG. 6 is given purely by way of example. However, it does show that complex multilayered coatings for electronic or optoelectronic applications can be produced in a simple way by combining through-contacts in the layers, interconnects, cavities and cut-outs. Moreover, optical components can be produced by suitable patterning of the layer or layers which include a vitreous material. In this respect, FIG. 7 shows an example in which a phase grating has been produced by the patterning in accordance with the invention.

In this case, first of all, as has been explained with reference to FIGS. 1A to 1E and FIGS. 2A and 2B, a second coating 71 was produced on the side 2 of the substrate 1. To produce a phase grating, these structures advantageously comprise a regular arrangement of trenches 40 which extend in a straight or curved line along the surface 2 in the patterned layer 71 which comprises a vitreous material. With trenches which run in a curved line along the surface of the substrate 1 it is possible, for example, to achieve focusing effects. To produce a phase grating, the trenches 40 in the layer 7 are filled with a transparent material 29 which preferably has a different refractive index than the layer 71. A further layer 72, which is used as a spacer, is applied to the phase grating which has been created in this way in the layer 71.

The coated substrate 1 which has been produced in this way in this exemplary embodiment itself serves as a cover for a further substrate 25. To this end, the coated substrate 1, after the patterned coating 7 has been produced, is joined to the further substrate 25 by means of a joining layer 27. In this embodiment, the substrate 25 includes an active layer 15. By way of example, the substrate may be an optoelectronic component or a micro-electromechanical component, the function of which interacts with the phase grating of the patterned coating 7.

Figure 8:
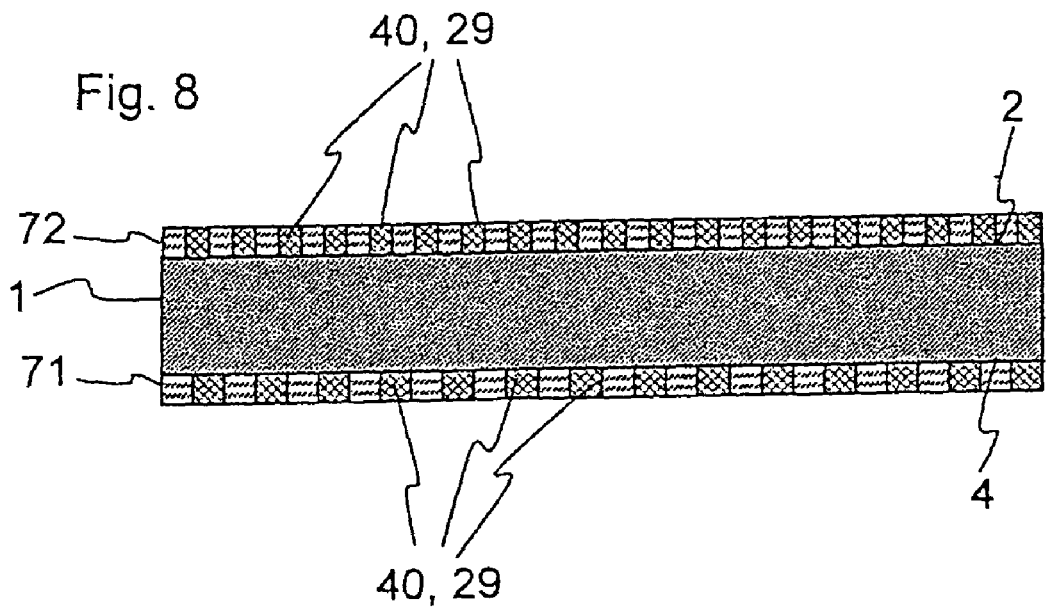
FIG. 8 shows an embodiment of a substrate which has been coated on two opposite sides, FIGS. 9 and 10 use diagrammatic cross sections to illustrate a further embodiment of a method for the patterned coating of a substrate.

FIG. 8 shows an embodiment of a coated substrate 1 which has patterned layers 71 and 72 on each of two opposite sides 2, 4. The patterned layers 71 and 72 were in this case produced as phase gratings in the same way as has been explained with reference to FIG. 7. The phase gratings on the opposite sides also have different periods. A coated substrate of this type may, for example, be used as an optical filter with a high resolution. Of course, it is also possible for other patterned coatings, such as for example a multilayered patterned layer 7 which has been illustrated with reference to FIG. 6, to be applied to one or both sides of a substrate of this type which has been coated on more than one side.

Figure 9:
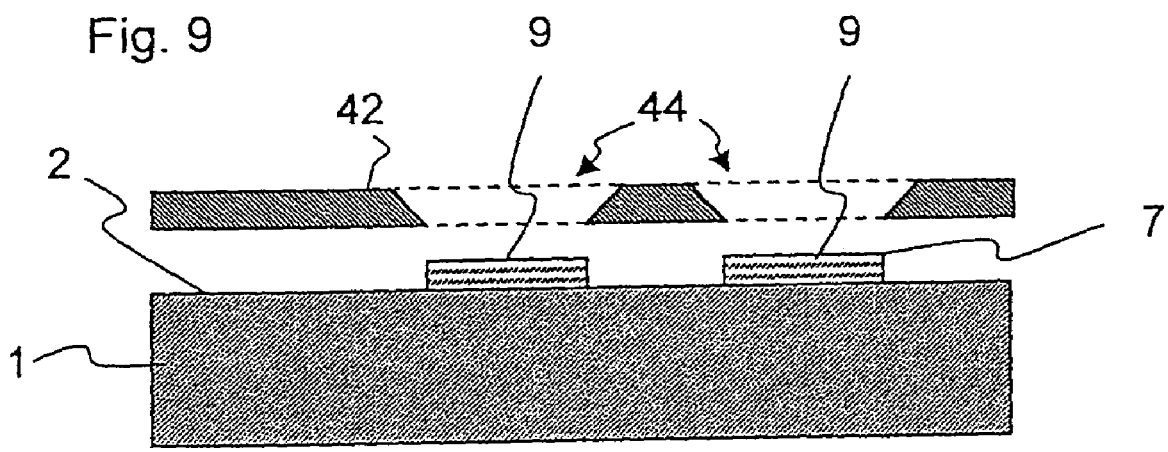
Figure 10:
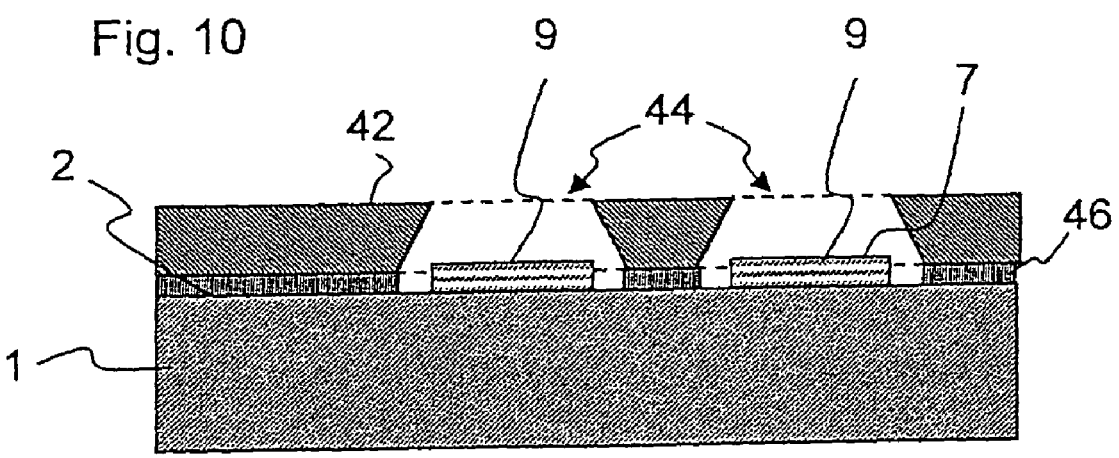

The following text refers to FIGS. 9 and 10, which use diagrammatic cross sections to illustrate two further embodiments of a method for producing a patterned vitreous layer on a substrate.

As illustrated in FIG. 9, to produce a layer of this type, a mask 42 is arranged in front of the surface 2 of the substrate 1 which is to be coated, so that the mask is located between the surface 2 and the coating source (not shown). The coating source used is preferably once again an evaporator, in particular an electron beam evaporator for evaporation-coating glass. The mask 42 has openings and/or cut-outs 44 in the shape of and at the intended position of the structures which are to be applied. After the mask 42 has been positioned in front of the surface 2, the layer 7 is deposited, this layer then having structures 9 which correspond to the openings 44. Contrary to what is illustrated in FIG. 9, the mask 42 may also be placed in direct contact with the surface 2 in order to be at the minimum possible distance from the surface 2. The mask 42 may in particular also be joined to the substrate 1, so that any deformation to the mask or substrate does not lead to an increased distance between the mask and the surface 2. A refinement of the method of this type is illustrated in FIG. 10. In the embodiment shown in FIG. 10, the substrate was joined to the mask 42 by an adhesive bond 46 prior to the evaporation coating. The mask can then be detached again after the evaporation-coating glass layer has been deposited, so that once again, in a similar manner to the embodiment of the invention described above, a product with a patterned evaporation-coating glass layer is obtained on the surface 2 of the substrate.

Of course, the substrate may also be coated on more than one side. Moreover, it is also possible for multilayered patterned coatings to be applied to a plurality of sides, in particular to two opposite sides, of the substrate in a similar manner to the embodiments of methods according to the invention which have been described with reference to FIGS. 3A to 3F and/or FIGS. 4A to 4C.

Figure 11:
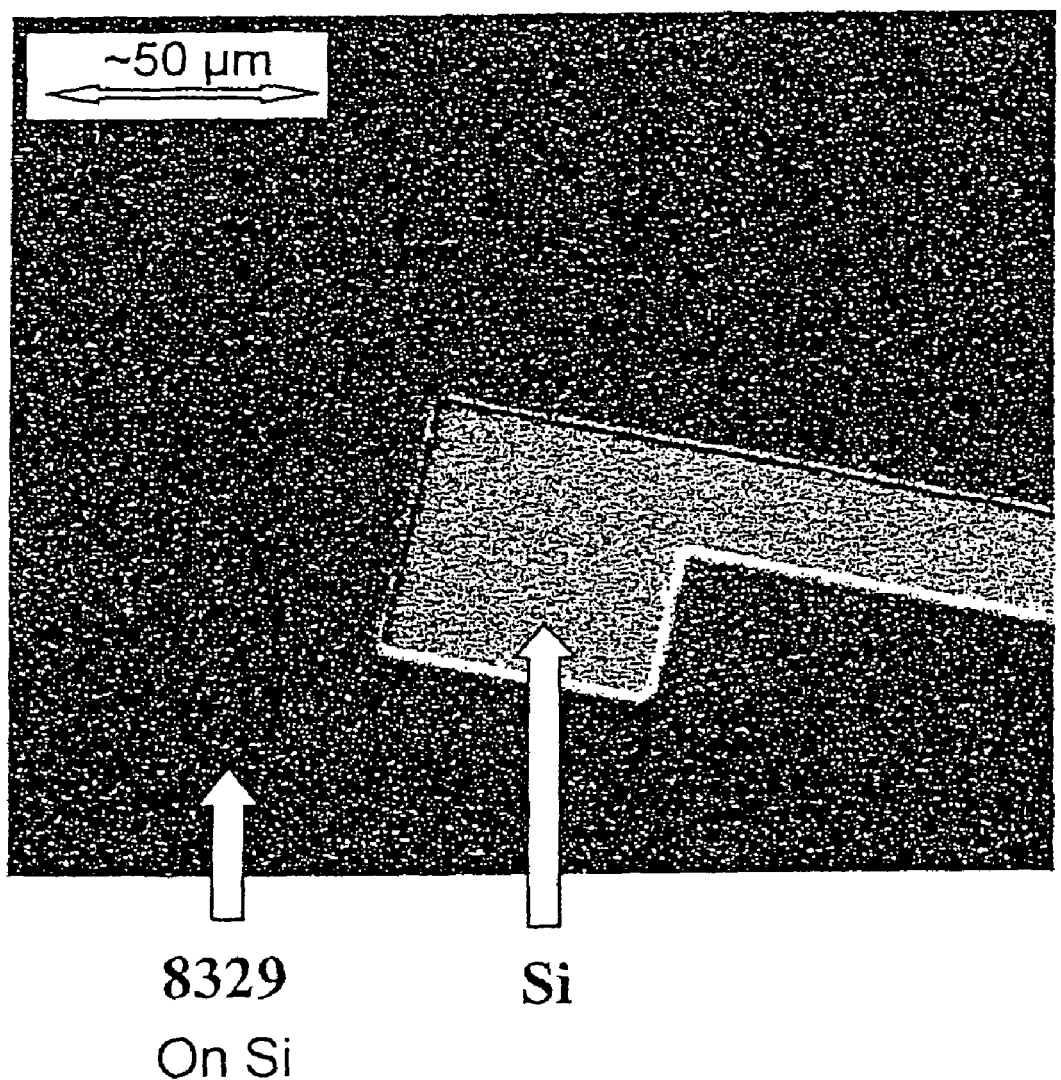
FIG. 11 shows an electron microscope image of part of the surface of a substrate which has been coated in accordance with the invention.

FIG. 11 shows an electron microscope image of part of the surface of a substrate which has been coated in accordance with the invention. The substrate used was silicon and the evaporation-coating glass used was the abovementioned glass 8329. In accordance with the invention, the structures in the evaporation-coating glass layer were produced by evaporation coating onto a patterned first coating followed by lift-off of the regions of the glass layer on the first coating by dissolving the first coating. The image shows that very well-defined glass structures can be produced on substrates using the method according to the invention.

List of Reference Symbols

| | |
|---|---|
| 1 | Substrate |
| 2 | First surface, which is to be coated, of the substrate |
| 3, 31, 32 | First coating |
| 4 | Opposite, second surface of the substrate |
| 5, 12 | Negative structures in first coating 3 |
| 6 | Uncovered region on surface 2 |
| 7 | Patterned layer |
| 8 | Diffusion barrier layer |
| 9, 9A, 9B | Positive structures of layer 7 |
| 94 | Strip-like structures in second layer 7 |
| 71, 72, 73, 74 | Individual layers of a multiple patterned layer 7 |
| 91, 92, 93 | Structures of the individual layers 71, 72, 73 |
| 11 | Unsupported regions |
| 13 | Cut-out in layer 7 |
| 14 | Contact surfaces |
| 15 | Active layer |
| 17 | Through-contact |
| 19 | Interconnects |
| 21 | Cavity |
| 23 | Component |
| 25 | Further substrate |
| 27 | Connecting layer |
| 29 | Transparent filling |
| 40 | Trenches in layer 7 |
| 42 | Mask |
| 44 | Opening in 42 |
| 46 | Adhesive bond |

The invention claimed is:

1. A method for the patterned coating of a substrate having at least one surface, comprising the steps of:

producing at least one negatively patterned first coating on the at least one surface, the at least one negatively patterned first coating having a first thickness;

depositing at least one second layer on the at least one surface that has been provided with the at least one negatively patterned first coating, said at least one second layer including an evaporation-coating glass, the at least one second layer having a second thickness that is less than the first thickness so that the second layer is discontinuous and access to the at least one negatively patterned first coating is retained; and at least partially removing the at least one negatively patterned first coating.

2. The method as claimed in claim 1, wherein the step of producing the at least one negatively patterned first coating comprises the step of uncovering a plurality of regions of the at least one surface.

3. The method as claimed in claim 1, wherein the substrate is part of a wafer.

4. The method as claimed in claim 1, wherein the deposition by evaporation coating comprises the step of plasma ion-enhanced evaporation coating.

5. The method as claimed in claim 1, wherein the deposition by evaporation coating comprises the step of electron beam evaporation.

6. The method as claimed in claim 1, wherein the step of evaporation coating comprises the step of evaporation of evaporation-coating a material with a vitreous structure on the at least one surface from a single source.

7. The method as claimed in claim 1, wherein the step of evaporation comprises the step of co-evaporation from at least two sources.

8. The method as claimed in claim 1, wherein the step of depositing the at least one second layer comprises the step of depositing a composition which varies in a direction perpendicular to the at least one surface.

9. The method as claimed in claim 1, wherein the step of depositing the at least one second layer comprises sputtering.

10. The method as claimed in claim 1, wherein the step of depositing the at least one second layer comprises chemical vapor depositing.

11. The method as claimed in claim 1, wherein the step of depositing the at least one second layer comprises the step of depositing an at least binary materials system.

12. The method as claimed in claim 1, wherein the step of depositing the at least one second layer comprises co-deposition of organic material.

13. The method as claimed in claim 1, wherein the step of producing the at lease one negatively patterned first coating comprises the step of resist-coating.

14. A method for the patterned coating of a substrate having at least one surface, comprising the steps of:
producing at least one negatively patterned first coating on the at least one surface;
depositing at least one second layer on the at least one surface that has been provided with the at least one negatively patterned first coating, said at least one second layer including an evaporation-coating glass; and
at least partially removing the at least one negatively patterned first coating, wherein the step of producing the at least one negatively patterned first coating comprises the step of embossing.

15. The method as claimed in claim 1, wherein the step of producing the at least one negatively patterned first coating comprises the step of applying a photoresist film.

16. The method as claimed in claim 1, wherein the step of producing the at least one negatively patterned first coating comprises screen printing.

17. The method as claimed in claim 1, wherein the step of producing the at least one negatively patterned first coating comprises the step of applying a photopatternable layer.

18. The method as claimed in claim 1, wherein the step of at least partially removing the at least one negatively patterned first coating comprises the step of dissolving at least one portion of the at least one negatively patterned first coating in a solvent.

19. The method as claimed in claim 1, wherein the step of at least partially removing the at least one negatively patterned first coating comprises the step of wet-chemical removal of at least one portion of the at least one negatively patterned first coating.

20. The method as claimed in claim 1, wherein the step of at least partially removing the at least one negatively patterned first coating comprises the step of dry-chemical removal of at least one portion of the at least one negatively patterned first coating.

21. The method as claimed in claim 1, wherein the step of at least partially removing the at least one negatively patterned first coating comprises the step of lifting off a plurality of regions of the at least one second layer.

22. The method as claimed in claim 1, further comprising the step of at least partially uncovering the at least one negatively patterned first coating.

23. The method as claimed in claim 22, wherein the step of at least partially uncovering the at least one negatively patterned first coating comprises the step of planarizing the at least one surface.

24. The method as claimed in claim 22, wherein the step of partially uncovering the at least one negatively patterned first coating comprises the step of mechanical abrasion.

25. The method as claimed in claim 1, further comprising exposing the at least one second layer to an aftertreatment process selected from the group consisting of a wet-chemical process, a dry-chemical process, a thermal reflow process, a doping process, and any combinations thereof.

26. The method as claimed in claim 1, further comprising repeating the steps of producing the at least one negatively patterned first coating on the at least one surface and of depositing the at least one second layer.

27. The method as claimed in claim 1, further comprising the step of joining the at least one substrate to a further substrate selected from the group consisting of a semiconductor component, an optoelectronic component, a micro-electromechanical component, and any combinations thereof.

28. The method as claimed in claim 1, wherein the at least one second layer forms a component selected from the group consisting of at least one phase grating, at least one optical component, at least one channel, at least one waveguide, and any combinations thereof.

29. A method for the patterned coating of a substrate having at least one surface, comprising the steps of:
producing at least one negatively patterned first coating on the at least one surface;
depositing at least one second layer on the at least one surface that has been provided with the at least one negatively patterned first coating, said at least one second layer including an evaporation-coating glass;
at least partially removing the at least one negatively patterned first coating; and
at least partially filling structures of the at least one second layer with a conductive material and/or a transparent material.

30. The method as claimed in claim 1, further comprising the step of applying at least one conductive region to the at least one surface of the substrate and/or the at least one second layer.

31. The method as claimed in claim 29, wherein the step of filling structures in the at least one second layer comprises the step of producing at least one passive electronic component selected from the group consisting of a capacitor, a resistor, an inductor, and any combinations thereof.

32. The method as claimed in claim 1, further comprising the steps of:
producing the at least one negatively patterned first coating on at least two surfaces of the substrate;

depositing the at least one second layer on the at least two surfaces; and at least partially removing the at least one negatively patterned first coating from each of the at least two surfaces.

33. The method as claimed in claim 1, further comprising the step of applying a bonding layer to the at least one second layer, wherein the bonding layer comprises a seed layer for a subsequent metallization and/or an adhesive layer.

34. A method for the patterned coating of a substrate having at least one surface, comprising the steps of:

producing at least one negatively patterned first coating on the at least one surface;

depositing at least one second layer on the at least one surface that has been provided with the at least one negatively patterned first coating, said at least one second layer including an evaporation-coating glass; and at least partially removing the at least one negatively patterned first coating, wherein the at least one second layer is deposited through a mask.

35. The method as claimed in claim 34, further comprising bringing the mask into contact with the at least one surface of the substrate.

36. The method as claimed in claim 34, further comprising joining the mask to the at least one surface.

37. The method as claimed in claim 34, further comprising adhesively bonding the mask to the substrate.

38. The method as claimed in claim 1, wherein the step of producing the at least one negatively patterned first coating comprises the step of lithographic patterning.

* * * * *